(12) United States Patent
Mahler et al.

(10) Patent No.: US 7,811,860 B2
(45) Date of Patent: Oct. 12, 2010

(54) METHOD FOR PRODUCING A DEVICE AND DEVICE

(75) Inventors: Joachim Mahler, Regensburg (DE); Markus Brunnbauer, Lappersdorf (DE); Manfred Mengel, Bad Abbach (DE); Christof Matthias Schilz, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 11/943,259

(22) Filed: Nov. 20, 2007

(65) Prior Publication Data

US 2008/0179760 A1 Jul. 31, 2008

(30) Foreign Application Priority Data

Jan. 31, 2007 (DE) .................. 10 2007 004 844

(51) Int. Cl.
*H01L 23/14* (2006.01)
*H01L 23/29* (2006.01)
*H01L 21/00* (2006.01)
*H01L 21/31* (2006.01)
*H01L 21/469* (2006.01)

(52) U.S. Cl. ............... 438/115; 438/783; 257/702; 257/793; 257/E21.502; 257/E23.002

(58) Field of Classification Search ........... 438/115, 438/124, 126, 127, 783; 257/701, 702, 787–795, 257/E21.002, E23.502
See application file for complete search history.

(56) References Cited

U.S. PATENT DOCUMENTS

| | | | | |
|---|---|---|---|---|
| 5,147,822 | A * | 9/1992 | Yamazaki et al. | 438/127 |
| 5,357,005 | A | 10/1994 | Buchwalter et al. | |
| 5,888,850 | A * | 3/1999 | Havens et al. | 438/127 |
| 6,043,167 | A * | 3/2000 | Lee et al. | 438/789 |
| 6,211,096 | B1 * | 4/2001 | Allman et al. | 438/787 |
| 6,214,749 | B1 * | 4/2001 | Watanabe et al. | 438/783 |
| 6,351,030 | B2 * | 2/2002 | Havens et al. | 257/690 |
| 6,399,478 | B2 * | 6/2002 | Matsubara et al. | 438/623 |
| 6,521,546 | B1 * | 2/2003 | Barnes et al. | 438/778 |
| 6,756,670 | B1 * | 6/2004 | Yamazaki et al. | 257/729 |
| 6,759,326 | B2 * | 7/2004 | Siegel et al. | 438/642 |
| 6,797,649 | B2 * | 9/2004 | Scherer et al. | 438/783 |
| 6,825,132 | B1 * | 11/2004 | Inoue et al. | 438/783 |
| 6,872,464 | B2 | 3/2005 | Hübner, et al. | |
| 7,211,838 | B2 * | 5/2007 | Miyazawa | 257/187 |
| 2002/0168480 | A1 | 11/2002 | Yoon et al. | |
| 2007/0020451 | A1 * | 1/2007 | Padiyath et al. | 428/336 |
| 2008/0179760 | A1 | 7/2008 | Mahler et al. | |
| 2009/0169770 | A1 * | 7/2009 | Padiyath et al. | 427/577 |
| 2009/0186209 | A1 * | 7/2009 | Padiyath et al. | 428/220 |

FOREIGN PATENT DOCUMENTS

| | | |
|---|---|---|
| DE | 10106779 | 8/2002 |
| JP | 62283133 | 12/1987 |
| JP | 63033411 | 2/1988 |
| JP | 2000040711 | 2/2000 |
| WO | 9951430 | 10/1999 |

* cited by examiner

*Primary Examiner*—David A Zarneke
(74) *Attorney, Agent, or Firm*—Dicke, Billig & Czaja, PLLC

(57) ABSTRACT

A method for producing a device and a device is disclosed. In one embodiment, a component is surrounded by a material. A fluoropolymer-containing compound is produced at a surface of the material. A molding is produced from a material and a fluoropolymer-containing compound is produced at a surface of the molding by a vapor deposition.

25 Claims, 4 Drawing Sheets

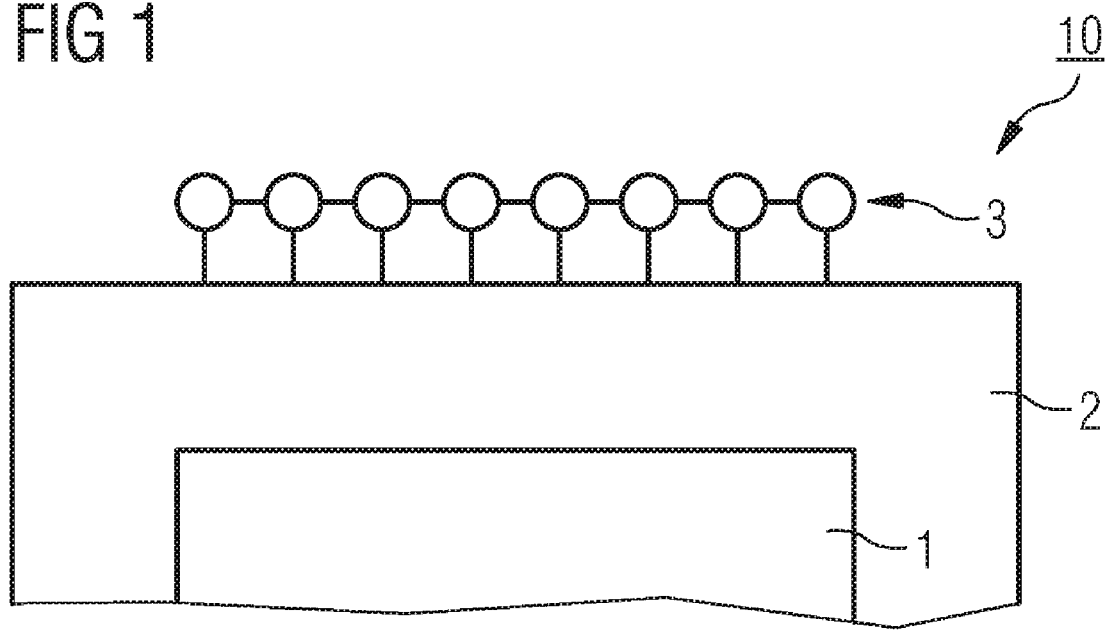
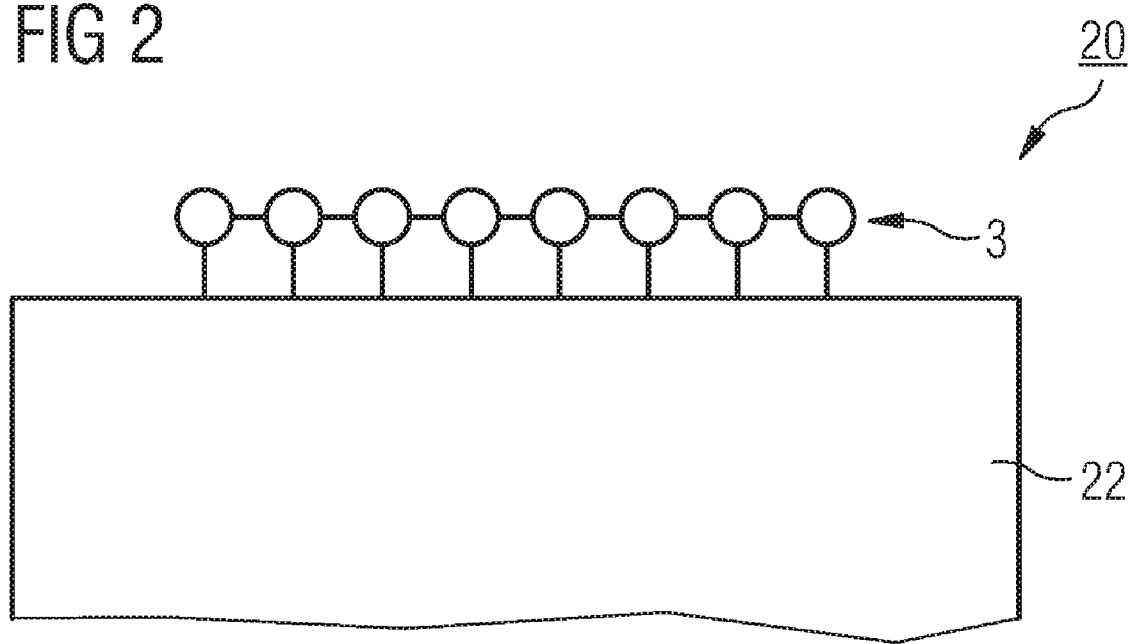

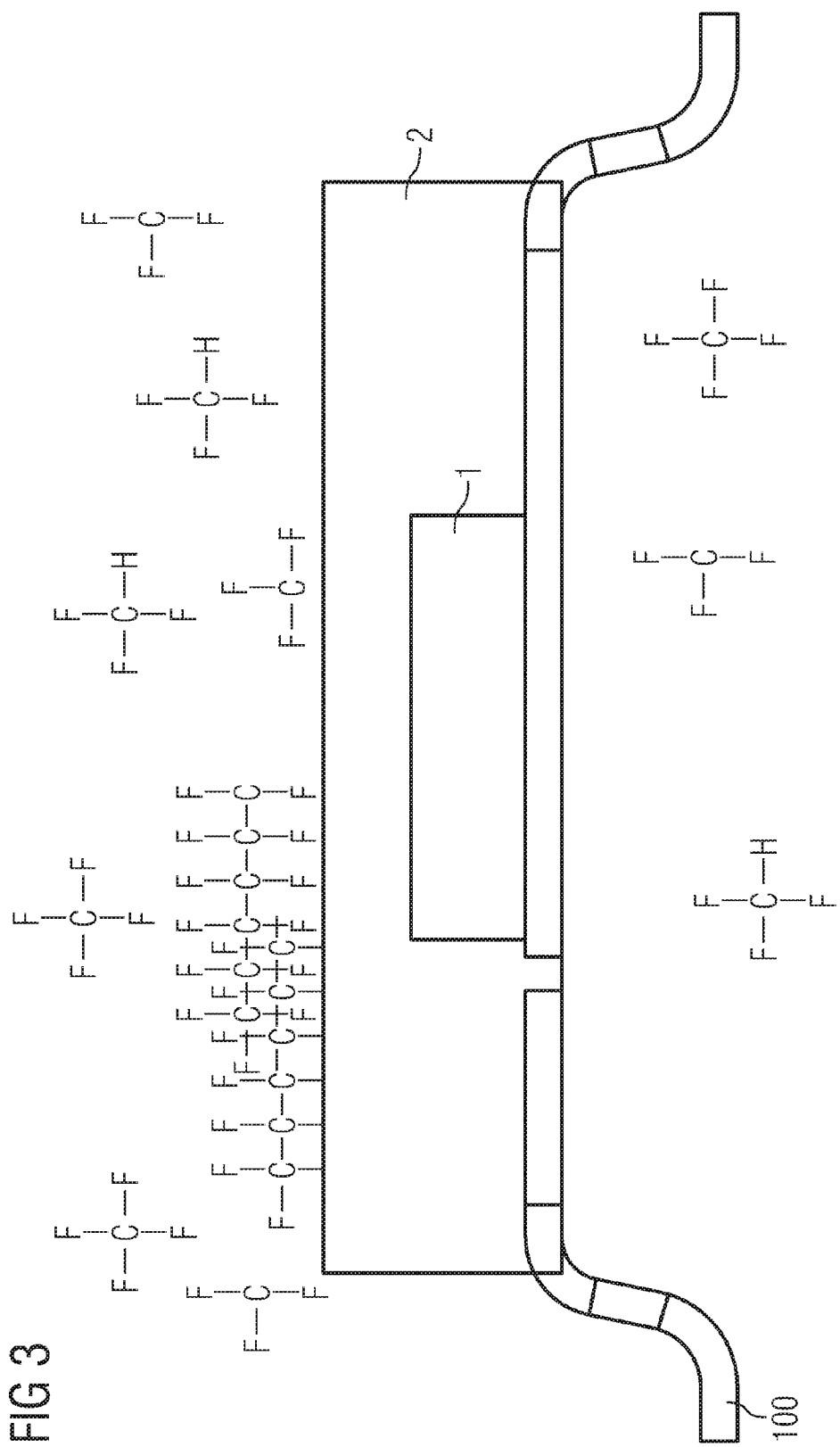

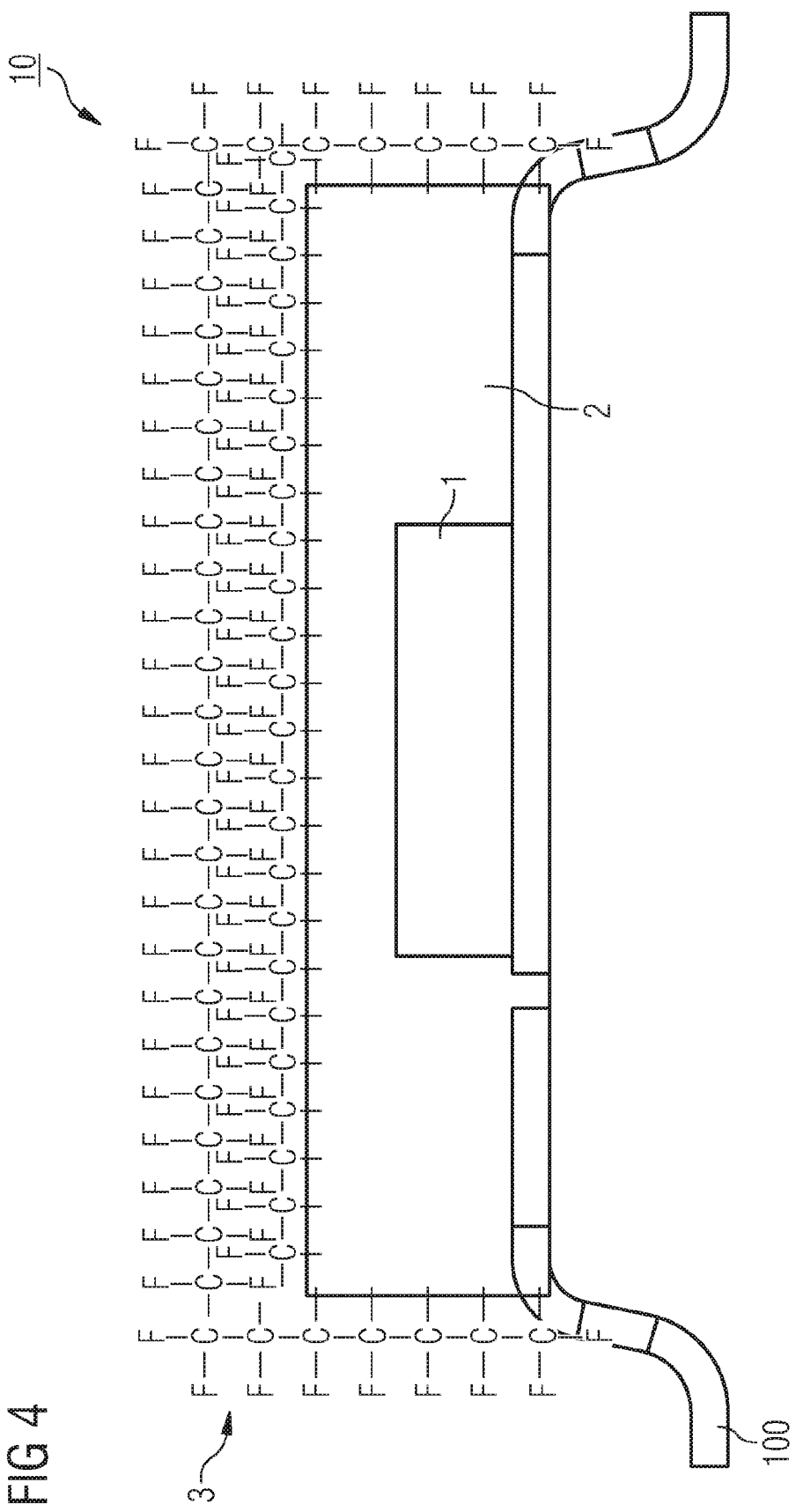

FIG 5
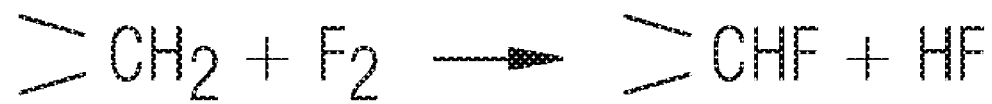

METHOD FOR PRODUCING A DEVICE AND DEVICE

CROSS-REFERENCE TO RELATED APPLICATIONS

This Utility Patent Application claims priority to German Patent Application No. DE 10 2007 004 844.2 filed on Jan. 31, 2007, which is incorporated herein by reference.

BACKGROUND

The present invention relates to a method for producing a device and to a device.

In the context of mounting integrated circuits, the semiconductor processing industry switched over from lead-through technology to surface mounting some time ago. Whereas only the connecting leads were heated in lead-through technology, the entire housing is heated in the case of the surface-mounted devices. With this new technology, however, new fault mechanisms arose, too, caused by the interaction of the moisture taken up from the surroundings and the increase in temperature.

In accordance with one embodiment, in a method for producing a device, a device element is surrounded by a material, and a fluoropolymer-containing compound is produced at a surface of the material.

In accordance with a further embodiment, in a method for producing a component, a molding is produced from a material, and a fluoropolymer-containing compound is produced at a surface of the molding.

In accordance with a further embodiment, a device includes a device element surrounded by material, and a fluoropolymer-containing compound at a surface of the material.

In accordance with a further embodiment, an apparatus includes a molding composed of a material and a fluoropolymer-containing compound at a surface of the molding.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a schematic illustration of an exemplary embodiment of a device.

FIG. 2 illustrates a schematic illustration of an exemplary embodiment of a component.

FIG. 3 illustrates a schematic illustration of a device during a method for producing it.

FIG. 4 illustrates a schematic illustration of a further exemplary embodiment of a device after the completion of the method.

FIG. 5 illustrates a representation of chemical reactions for illustrating a further embodiment of a device, a component and methods for producing them.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

A description is given below of devices which include device elements, and of methods for producing the devices. In this case, the invention is independent of the type of the device elements. Device elements may be any type of elements. In one embodiment, the device elements may be electrical, electromechanical and/or electro-optical device elements, e.g., integrated circuits, sensors, microelectro-mechanical device elements (MEMS) or laser diodes and the like. The device elements may be produced on a semiconductor basis, that is to say be provided as semiconductor device elements.

In accordance with one embodiment, the device element is surrounded by a material. The material may contain or include for example a resin such as epoxy resin or the like. The material may also have a different composition. The material may have, stated generally, any conceivable composition which can be used to form a potting or encapsulation composition with which the device element can be surrounded.

In accordance with one embodiment, the device element is surrounded by the material. In this case, it may be provided that the device element is completely or partly surrounded by the material. Therefore, the device element may be covered or surrounded by the material either with its entire surface or only on a part of its surface.

In accordance with one embodiment, a molding is produced from a material. The material may contain or include for example a resin such as epoxy resin or the like. However, the material may also have a different composition.

In accordance with one embodiment, the fluoropolymer-containing compound is produced at a surface of the material. It can, for example, be produced by a chemical reaction, wherein the chemical reaction can be initiated and/or controlled by, for example, one or more of heat or pressure or moisture or other parameters or by supplying specific substances like, for example, fluorine, to the surface. The fluoropolymer-containing compound can also be applied to the surface by, for example, a vapor deposition. In this case, a vapor deposition may include any method in which the fluoropolymer-containing compound is deposited from a gaseous phase onto the surface of the material. This also includes any types of CVD vapor deposition methods (chemical vapor deposition). In one embodiment, it may be provided that a plasma is contained in the gaseous phase. The deposition method may accordingly also be provided by a plasma-enhanced CVD method.

In accordance with a further embodiment, a fluoropolymer-containing compound is produced at a surface of the material of a molding. It can, for example, be produced by a chemical reaction, wherein the chemical reaction can be initiated and/or controlled by, for example, one or more of heat or pressure or moisture or other parameters or by supplying specific substances like, for example, fluorine, to the surface. The fluoropolymer-containing compound can also be applied to the surface by, for example, a vapor deposition. In this case, a vapor deposition may include any method in which the fluoropolymer-containing compound is deposited from a gaseous phase onto the surface of the material. This also includes any types of CVD vapor deposition methods (chemical vapor deposition). In one embodiment, it may be provided that a plasma is contained in the gaseous phase. The deposition method may accordingly also be provided by a plasma-enhanced CVD method.

The fluoropolymer-containing compound may be any conceivable fluorine-containing polymer compound. This may therefore involve both fluorine-containing polymers having exclusively carbon atoms in the main chain and those fluorine-containing polymers having heteroatoms in the main chain.

One embodiment of a device is illustrated schematically in cross section in FIG. 1. The device 10 includes a device element 1 surrounded by a material 2. In the embodiment illustrated, the device element 1 is not surrounded by the material 2 on all sides since the lower surface of the device element 1 is not covered by the material 2. It may be provided, for example, that the device element 1 is mounted by its lower surface on a substrate such as a PCB board, a leadframe or the like.

The device element 1 may be provided by a semiconductor component such as an integrated circuit or the like. The device element 1 is intended to be surrounded by the material 2 and thereby to be protected against external influences such as, for example, the ingress of moisture. The material 2 may have an epoxy-resin-based composition.

A fluoropolymer-containing compound 3 is present at a surface of the material 2, as is indicated schematically in FIG. 1. In this case, it may be provided that the fluoropolymer-containing compound 3 is present only at a specific surface section, as is likewise indicated in FIG. 1. However, the fluoropolymer-containing compound 3 may also be present at all outer surfaces of the material 2. The fluoropolymer-containing compound has a strongly hydrophobic effect, that is to say that it acts as an efficient diffusion barrier against water vapor. By using the fluoropolymer-containing compound, it is possible, therefore, to achieve an extreme reduction of the moisture absorption of the device during storage with exposure to moisture and, therefore, to greatly increase the reliability of the device element 1 even under conditions of high moisture during production. By using the fluoropolymer-containing compound, it is also possible to increase the storage time of the device and it is possible to choose less complicated packaging and transportation conditions. A further advantage is that the material 2 can be protected against organic solvents by using the fluoropolymer-containing compound 3.

The fluoropolymer-containing compound 3 can, for example, be applied as a layer, for example, to the surface of the material 2. The layer can be applied at room temperature, for example, with the result that no additional thermal loading arises for the device element 1. The fluoropolymer-containing compound 3 may be applied for example by using vapor deposition, in one embodiment by plasma-enhanced vapor deposition such as a plasma-enhanced CVD method. The fluoropolymer-containing compound 3 can also be produced at the surface of the material 2 by a chemical reaction as will be outlined later.

One embodiment of a component is illustrated schematically in cross section in FIG. 2. The component 20 includes a molding 22 composed of a material and a fluoropolymer-containing compound 23, which is present at a surface of the molding 22 and which is, for example, produced by a chemical reaction or applied or deposited by a vapor deposition. The material of the molding 22 may contain or include an epoxy resin. As in the case of the device 10 from FIG. 1, the fluoropolymer-containing compound 23 may be present on a section of the surface of the molding 22 or on the entire surface of the molding 22.

FIGS. 3 and 4 illustrate, on the basis of a further exemplary embodiment, two method stages in the production of a device on the basis of schematic illustrations of the device in cross section. FIG. 4 illustrates the completed device 10, while FIG. 3 illustrates a situation during the application of the fluoropolymer-containing compound by a vapor deposition.

A device element 1 such as a semiconductor device element 1, for example, is mounted on a leadframe 100. The device element 1 is surrounded by a material 2, which may be an epoxy resin, for example. Directly after the encapsulation of the device element 1 with the material 2, a thin layer 3 containing a fluoropolymer-containing compound is applied to the outer surfaces of the material 2 by a vapor deposition. The thin layer 3 may include a fluorocarbon polymer, by way of example. The thin layer 3 is distinguished by the fact that it combines stably with the material 2, that is to say—in the case of an epoxy resin—with the polymer of the epoxy resin. The fluoropolymer-containing compound is furthermore distinguished by the fact that it only weakly attacks or incipiently etches the metal surfaces of the leadframe 100 and of the connecting leads formed therefrom by bending processes. Polymeric layers of the fluoropolymer-containing compound that are possibly deposited on uncovered metallic surfaces such as the connecting leads or the unencapsulated rear side of the chip island can easily be eliminated, on account of their known poor adhesion on metals, in subsequent processes for eliminating thin encapsulation composition residues ("deflashing") or the application of the solder coating ("solder plating") including the previous surface activation.

The embodiment in FIG. 3 illustrates how the device element 1 surrounded by the material 2 is treated with a $CF_4$/$CHF_3$ gas mixture in a plasma chamber (not illustrated). As a result, a stable fluoropolymer layer 3 forms on the surface of the material 2 as a result of surface reactions between the gas radicals produced and the surface of the material 2, on the one hand, and also among the reactive molecular fragments produced (plasma polymerization). With a water vapor permeability of 0.03 $g/m^2$ per 24 hours (at 20° C. and 85% relative humidity), the layer 3 has a permeability to water vapor that is approximately 1000-fold lower than that of unfilled epoxy resins, which have a value of approximately 30 $g/m^2$ per 24 hours (at 20° C. and 85% relative humidity). In the case of highly filled epoxy resin molding compositions, however, the value may be lower by approximately one order of magnitude.

Preferably, in the embodiment in FIG. 3, the proportion of the $CF_4$ in the gas mixture is not more than 45%, in order that the polymerization of the gas mixture occurs. It is even more preferred for the proportion of the $CF_4$ in the $CF_4$/$CHF_3$ gas mixture to lie below 20%, in order to realize good deposition rates (>20 nm/min). At gas flow rates of a few 10 ccm, the process pressures should preferably not be less than 0.1 Torr while the power values of the radio-frequency generators used for plasma generation should preferably lie between 100 and 1000 watts. As an alternative to $CHF_3$ in the $CF_4$/$CHF_3$ gas mixtures, it is also possible to use other fluorocarbon gases such as e.g., $C_2H_2F_4$ or $CH_2F_2$.

As already mentioned, the material 2 may be an epoxy resin or be produced on the basis of epoxy resin. The application of the fluoropolymer-containing compound 3 on the surface of the material 2 also permits the use of relatively cost-effective epoxy resins which may have relatively unfavourable properties with regard to the moisture absorption. These are e.g., epoxy resin systems based on orthocresol novolak (OCN epoxides) and/or epoxy resin encapsulation compositions filled with quartz meal to a relatively small extent (<80% by weight $SiO_2$ filler). Furthermore, it is also no longer necessary to supply the material 2 with special additives for the absorption of moisture, or it is possible to use less highly moisture-resistant and thus usually more cost-effective additives.

The surface layer of the fluoropolymer-containing compound or of the fluorinated material can have a thickness of at least 10 nm or a thickness ranging from 10 nm to 100 nm, for example.

In FIG. 5 it is illustrated according to a further embodiment, how the fluoropolymer-containing compound can be produced by fluorinating the surface of the material, i.e. treating the surface with fluorine.

FIG. 5 illustrates different chemical reactions, which can be initiated and/or controlled at or in the vicinity of a surface of a material or of a molding. The material can be constituted of or include a polymer material and can be, for example, a conventional epoxy material. The illustrated chemical reactions are based essentially on replacing a hydrogen atom at a surface of the material by a fluorine atom. For the desired hydrophobic effect it can be sufficient that a specific proportion of the hydrogen atoms of the material are replaced by fluorine atoms, like, for example, more than 50% or more than any number in the range of from 20% to 70%.

The material can, for example, be produced at first by a molding process or the like on the device element. The process can, for example, be carried out such that immediately after this fabrication process the surface of the material will be conditioned or treated, for example, by treating the surface with fluorine gas. With this the fluorine atoms are chemically bound at the polymer, as is illustrated by the 3 chemical reactions of FIG. 5. All 3 reactions can participate with equal or unequal weights or only one or only two of them can participate.

The reactions are not necessarily restricted to the surface. The fluorine atoms or molecules can also penetrate to a certain depth and then react with the polymer. In such a way a fluorinated layer can be produced which has, for example, a thickness of more than 10 nm or a thickness in a range from 10 nm to 100 nm.

The above-described fluorinating process can also be carried out with the assistance of a plasma like, for example, a low-pressure plasma. In one embodiment, the treatment can be carried out in an atmosphere consisting of or including a carrier gas and a fluorine gas. In any case it is conceivable that the process can be carried out at room temperature. With both methods, namely low pressure plasma and treatment in carrier gas/fluorine atmosphere, very low surface energies can be reached. Typical values for surface free energies below 20 dynes/cm have been observed, resulting in typical contact angles clearly above 70 degrees (depending on the very nature of the polymers). Such surfaces illustrate a reduced ability to adsorb water and the dielectric behaviour of the fluorinated polymer chain parts reduces the permeability of the outermost mold compound regions for water molecules and even oxygen. A closer look at the equations describing diffusion (Fick equation, second Fick law) illustrates, that a reduction of the source concentration $N_S$ of course reduces the concentration within the absorbing body at any position and time $N_{x,t}$.

$$N_{x,t} = N_S \text{erfc}\left[\frac{x}{2\sqrt{D_t}}\right]$$

with $$\text{erfc}[y] = 1 - \text{erf}[y]$$

and $$\text{erf}[y] = \frac{2}{\sqrt{\pi}} \int e^{-\alpha^2} d\alpha$$

Also other ways of fluorinating the surface are conceivable. For example, other atoms than hydrogen atoms can be replaced by fluorine atoms or fluorine atoms can be incorporated in another way into the material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a device comprising:
   surrounding a device element by a material; and
   producing a fluoropolymer-containing compound at a surface of the material.

2. The method of claim 1, comprising applying the fluoropolymer-containing compound to the surface.

3. The method of claim 1, comprising producing the fluoropolymer-containing compound by altering the material at the surface.

4. The method of claim 1, comprising supplying a substance containing or consisting of fluorine to the surface for forming the fluoropolymer-containing compound.

5. The method of claim 1, comprising producing the fluoropolymer-containing compound by a vapor deposition.

6. The method of claim 5, comprising producing the fluoropolymer-containing compound by treating the material surrounding the device element being with CF4/CHF3 gas mixture.

7. A method for producing a component comprising:
   producing a molding from a material; and
   producing a fluoropolymer-containing compound at a surface of the molding.

8. The method of claim 7, comprising applying the fluoropolymer-containing compound to the surface.

9. The method of claim 7, comprising producing the fluoropolymer-containing compound by altering the material at the surface.

10. The method of claim 7, comprising supplying a substance containing or consisting of fluorine to the surface for forming the fluoropolymer-containing compound.

11. The method of claim 7, comprising producing the fluoropolymer-containing compound by a vapor deposition.

12. The method of claim 11, comprising producing the fluoropolymer-containing compound by treating the material surrounding the device element being with CF4/CHF3 gas mixture.

13. A device, comprising:
   a device element surrounded by a material; and
   a fluoropolymer-containing compound at a surface of the material.

14. The device of claim 13, comprising wherein the material consists of an epoxy resin.

15. The device of claim 13, comprising wherein the material consists of a polymer, wherein at a surface of the material atoms of the polymer are replaced by fluorine atoms.

16. The device of claim 15, comprising wherein hydrogen atoms of the polymer are replaced by fluorine atoms.

17. The device of claim 13, comprising:
   a fluoropolymer-containing compound layer at a surface of the material.

18. The device of claim 17, wherein the layer comprises a thickness of at least 10 nm, in particular in a range from 10 nm to 100 nm.

19. A component comprising:
   a molding composed of a material; and
   a fluoropolymer-containing compound produced at a surface of the molding, the compound being applied by using a vapor deposition.

20. The component of claim 19, comprising wherein the material consists of an epoxy resin.

21. The component of claim 19, comprising wherein the material consists of a polymer, wherein at a surface of the material atoms of the polymer are replaced by fluorine atoms.

22. The component of claim 15, comprising wherein hydrogen atoms of the polymer are replaced by fluorine atoms.

23. The component of claim 19, comprising:
   a fluoropolymer-containing compound layer at a surface of the material.

24. The component of claim 23, wherein the layer comprises a thickness of at least 10 nm, in particular in a range from 10 nm to 100 nm.

25. An integrated device, comprising:
   an integrated circuit, semiconductor device element at least partially surrounded by a material; and
   a fluoropolymer-containing compound at a surface of the material.

* * * * *